United States Patent
Tsuchida et al.

(10) Patent No.: US 7,934,592 B2
(45) Date of Patent: May 3, 2011

(54) CONVEYING SYSTEM WHICH CONVEYS AN OBJECT FROM A FIRST BUILDING TO A SECOND BUILDING

(75) Inventors: Masashi Tsuchida, Mie (JP); Hideki Tsujii, Mie (JP); Takahiko Futami, Mie (JP)

(73) Assignee: Muratec Automation Co., Ltd., Kyoto-shi, Kyoto (JP)

( * ) Notice: Subject to any disclaimer, the term of this patent is extended or adjusted under 35 U.S.C. 154(b) by 189 days.

(21) Appl. No.: 12/125,562

(22) Filed: May 22, 2008

(65) Prior Publication Data

US 2009/0127073 A1    May 21, 2009

(30) Foreign Application Priority Data

May 23, 2007 (JP) .................. P2007-136494

(51) Int. Cl.
B65G 21/10 (2006.01)
(52) U.S. Cl. .................. 198/587; 198/861.1
(58) Field of Classification Search .......... 198/587, 198/588, 589, 861.1, 861.2; 52/167.4
See application file for complete search history.

(56) References Cited

U.S. PATENT DOCUMENTS

| | | | | |
|---|---|---|---|---|
| 2,232,081 A * | 2/1941 | Sloane | | 198/587 |
| 2,679,314 A * | 5/1954 | Van Dijk | | 198/830 |
| 2,722,409 A * | 11/1955 | Bergmann | | 299/56 |
| 2,910,191 A * | 10/1959 | Sullinger | | 213/75 R |
| 3,735,952 A * | 5/1973 | Platus et al. | | 248/562 |
| 3,754,638 A * | 8/1973 | Mead | | 198/369.1 |
| 3,911,830 A * | 10/1975 | Adams | | 105/164 |
| 4,139,087 A * | 2/1979 | Westhoff et al. | | 198/309 |
| 4,269,011 A * | 5/1981 | Ikonomou | | 52/167.4 |
| 4,538,722 A * | 9/1985 | Sumner | | 198/861.2 |
| 4,618,057 A * | 10/1986 | Howser | | 198/861.2 |
| 4,775,047 A * | 10/1988 | Grall | | 198/861.2 |
| 4,972,940 A * | 11/1990 | Gleason | | 198/588 |
| 5,215,422 A * | 6/1993 | Snead | | 414/339 |
| 5,377,910 A * | 1/1995 | Newton | | 238/121 |
| 5,588,790 A * | 12/1996 | Lichti | | 414/331.03 |
| 5,749,452 A * | 5/1998 | Kanenwischer | | 198/301 |
| 6,155,400 A * | 12/2000 | Daigh et al. | | 198/301 |
| 6,227,377 B1 * | 5/2001 | Bonnet | | 209/650 |
| 6,321,657 B1 * | 11/2001 | Owen | | 104/119 |
| 6,827,024 B2 * | 12/2004 | Kassab et al. | | 105/157.1 |
| 7,302,319 B2 * | 11/2007 | Wu | | 701/19 |
| 7,409,799 B2 * | 8/2008 | Tsai | | 52/167.6 |
| 7,472,518 B2 * | 1/2009 | Tsai | | 52/167.6 |
| 7,562,764 B2 * | 7/2009 | Schmidt et al. | | 198/735.6 |
| 7,600,627 B2 * | 10/2009 | Ishikawa et al. | | 198/330 |

FOREIGN PATENT DOCUMENTS

JP      2002-337247      11/2002

* cited by examiner

*Primary Examiner* — Joe Dillon, Jr.
(74) *Attorney, Agent, or Firm* — Drinker Biddle & Reath LLP (57) ABSTRACT

A plurality of conveying apparatuses ace arranged from the inside of the first building to the inside of the second building along a conveying direction. A plurality of connection mechanisms connect each pair of adjacent conveying apparatuses such that the conveying apparatuses are arranged in a meandering manner in a case where relative positions between the first building and the second building are changed.

2 Claims, 7 Drawing Sheets

CONVEYING SYSTEM WHICH CONVEYS AN OBJECT FROM A FIRST BUILDING TO A SECOND BUILDING

Priority is claimed to Japanese Patent Application No. 2007-136494 filed on May 23, 2007, the disclosure of which, including the specification, drawings and claims, is incorporated herein by reference in its entirety.

BACKGROUND

The present invention relates to a conveying system, and more particularly, to a conveying system that conveys a conveying object over a plurality of buildings by using a plurality of conveying apparatuses installed over the plurality of buildings.

A conveying system for conveying a conveying object by using a plurality of conveying apparatuses that are independently driven or stopped has been known (for example, see Patent Document 1).

However, when the conveying system as disclosed in Patent Document 1 is built in a large scale, conveying apparatuses constituting the conveying system may be installed over a plurality of buildings. In such a case, a conveying object is moved between buildings by exchange of the conveying object between conveying apparatuses relating to connection parts of adjacent buildings.

Patent Document 1: Japanese Patent Publication No. 2002-337247A

However, when relative position between the adjacent buildings is changed due to the influence of an earthquake, a big wind, or the like, there is a problem that the relative positions between the conveying apparatuses which are disposed at connection parts of the adjacent buildings are changed. As a result, a distance between the conveying apparatuses disposed at the connection parts of the adjacent buildings increases, and there is a problem that the conveying object cannot be exchanged between the buildings.

SUMMARY

It is therefore an object of at least one embodiment of the present invention to provide a conveying system capable of conveying a conveying object even in a case where the relative position between buildings is changed.

In order to achieve the above-described object, according to an aspect of at least one embodiment of the present invention, there is provided a conveying system operable to convey a conveying object from a first building to a second building, the conveying system comprising: a plurality of conveying apparatuses arranged from the inside of the first building to the inside of the second building along a conveying direction; a plurality of connection mechanisms connecting each pair of adjacent conveying apparatuses such that the conveying apparatuses are arranged in a meandering manner in a case where relative positions between the first building and the second building are changed.

According to the above-described configuration, even in a case where the relative position between the first building and the second building are changed due to an earthquake or a big wind, the plurality of the conveying apparatuses are arranged in a meandering manner through the connection mechanisms. Accordingly, the plurality of the conveying apparatuses can be arranged in the gradually meandering manner until the plurality of the conveying apparatuses reaches the conveying apparatus of the second building which is relatively deviated with respect to the first building. As a result, it is possible to convey the conveying object from the first building to the second building by using the plurality of the conveying apparatuses arranged in the meandering manner.

Each of the connection mechanisms may include: a first connection member provided in a first conveying apparatus of the conveying apparatuses; a second connection member provided in a second conveying apparatus of the conveying apparatuses, the second conveying apparatus located adjacent to the first conveying apparatus; a cam groove formed in the first connection member along the conveying direction; and at least two cam pins provided in the second connection member and movably inserted into the cam groove. With the above-described configuration, even when the first conveying apparatus and the second conveying apparatus are deviated from each other in a direction for intersection the conveying direction in accordance with the change in relative position between the first and second buildings, the cam pin is engaged with the cam groove, and accordingly one conveying apparatus is moved so as not to be apart from the other apparatus. In such a case, since the first conveying apparatus and/or the second conveying apparatus are disposed to be rotated to face each other through the cam pin that is inserted into the cam groove, exchange of the conveying object can be performed in an easy manner. In addition, by disposing the cam groove along the conveying direction, a predetermined movement of the conveying apparatus in the conveying direction can be freely made without being interfered by other conveying apparatuses. As a result, a plurality of the conveying apparatuses can be arranged in a meandering manner, and thereby it is possible to convey a conveying object from the first building to the second building.

In addition, by providing at least two or more cam pins that are inserted into the cam groove, at least two cam pins are brought into contact with the inner wall of the cam groove even when the first conveying apparatus and/or the second conveying apparatus are rotated. Accordingly, rotation of the conveying apparatuses can be regulated. As a result, an angle formed by the conveying directions of the first and second conveying apparatuses is regulated, and thereby a conveying object can be smoothly conveyed from the first conveying apparatus to the second conveying apparatus.

Each of the connection mechanisms may include: a first connection member provided in a first conveying apparatus of the conveying apparatuses; a second connection member provided in a second conveying apparatus of the conveying apparatuses, the second conveying apparatus located adjacent to the first conveying apparatus; a cam groove formed in the first connection member along the conveying direction; a cam pin provided in the second connection member and movably inserted into the cam groove; and a rotation regulating member regulating rotation of the first connection member or the second connection member around the cam pin. With the above-described configuration, even when the first conveying apparatus and the second conveying apparatus are deviated from each other in a direction for intersection the conveying direction in accordance with the change in relative positions of the first and second buildings, the cam pin is engaged with the cam groove, and accordingly one conveying apparatus is moved so as not to be apart from the other apparatus. In such a case, since the first conveying apparatus and/or the second conveying apparatus are disposed to be rotated around the cam pin, which is inserted into the cam groove, to face each other, exchange of a conveying object can be performed in an easy manner. In addition, by disposing the cam groove along the conveying direction, a predetermined movement of the conveying apparatus in the conveying direction can be freely made without being interfered by other conveying apparatuses. As a result, the plurality of the conveying apparatuses can be arranged in a meandering manner, and thereby it is possible to convey a conveying object from the first building to the second building.

In addition, by disposing a rotation regulating member, the rotation of the first conveying apparatus and/or the second conveying apparatus can be regulated. As a result, an angle formed by the conveying directions of the first and second conveying apparatuses is regulated, and thereby a conveying object can be smoothly conveyed from the first conveying apparatus to the second conveying apparatus.

Each of the connection mechanisms may include: a first connection member provided in a first conveying apparatus of the conveying apparatuses; a second connection member provided in a second conveying apparatus of the conveying apparatuses, the second conveying apparatus located adjacent to the first conveying apparatus; a pair of cam grooves formed in the first connection member along the conveying direction; a pin attaching portion formed in the second connection member; and a cam pin movably inserted into the cam grooves and attached to the pin attaching portion such that a predetermined gap is formed therebetween. With the above-described configuration, even when the first conveying apparatus and the second conveying apparatus are deviated from each other in a direction for intersection the conveying direction in accordance with the change in relative positions of the first and second buildings, the cam pin is engaged with the cam groove, and accordingly one conveying apparatus is moved so as not to be apart from the other apparatus. In such a case, by arranging a predetermined gap between the cam pin and the pin attaching unit, the first and the second conveying apparatuses are disposed to be rotated to face each other, and accordingly, exchange of a conveying object can be performed in an easy manner. In addition, by disposing the cam groove along the conveying direction, a predetermined movement of the conveying apparatus in the conveying direction can be freely made without being interfered by other conveying apparatuses. As a result, the plurality of the conveying apparatuses can be arranged in a meandering manner, and thereby it is possible to convey a conveying object from the first building to the second building.

In such a case, the cam pin and the pin attaching unit are brought into contact with each other, and accordingly, the rotation of the conveying apparatuses is regulated. As a result, an angle formed by the conveying directions of the first and second conveying apparatuses is regulated, and thereby a conveying object can be smoothly conveyed from the first conveying apparatus to the second conveying apparatus.

The cam pin may be broken when the first connection member and the second connection member are moved apart from each other beyond a predetermined gap or are moved close to each other within a predetermined gap. With the above-described configuration, when the relative positions of the first building and the second building are changed markedly, the cam pint connecting the first conveying apparatus and the second conveying apparatus is broken, and thereby it is possible to suppress influence on conveying apparatuses other than the first and second conveying apparatuses.

The conveying apparatuses may be movably and rotatably installed on a plurality of installation members, each of which is fixed to the first building or the second building. With the above-described configuration, the movement and rotation of the conveying apparatuses on the installment member can be easily made, and accordingly, it is possible to arrange the plurality of the conveying apparatuses in a meandering manner.

The conveying system may be operable to convey a front opening unified pod which accommodates a semiconductor wafer.

BRIEF DESCRIPTION OF THE DRAWINGS

The above objects and advantages of the present invention will become more apparent by describing in detail exemplary embodiments thereof with reference to the accompanying drawings, wherein.

DETAILED DESCRIPTION OF THE EMBODIMENTS

Hereinafter, embodiments of the present invention will be described in detail with reference to the accompanying drawings.

First Embodiment

A conveying system 1 according to the first embodiment of the present invention will be described with reference to FIGS. 1 to 4.

Figure 1:
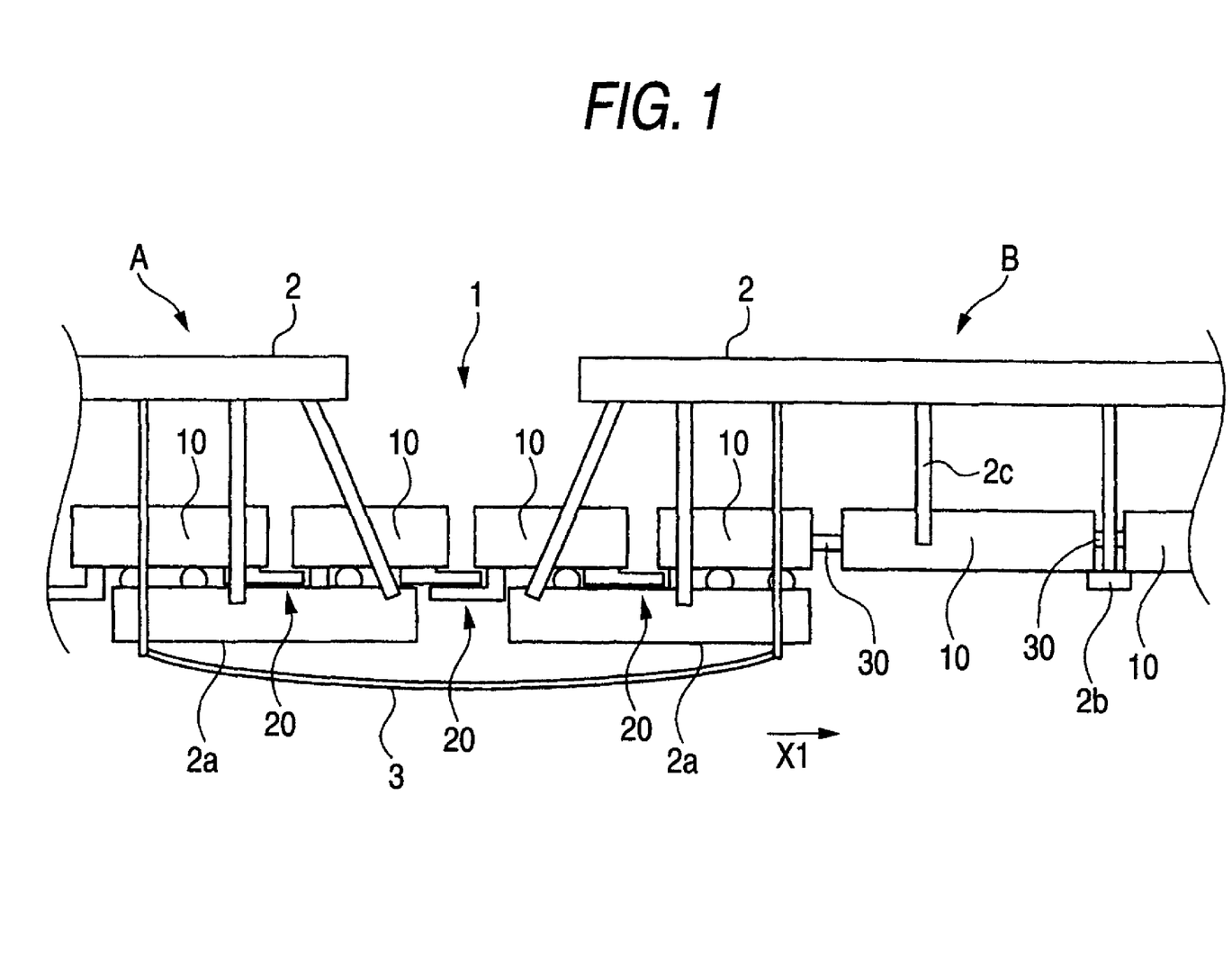
FIG. 1 is a side view showing a conveying system according to a first embodiment of the present invention which is installed inside buildings.

The conveying system 1 according to this embodiment is a conveying system that conveys a conveying object such as Front-Opening Unified Pod (FOUP) over a plurality of buildings. The FOUP can accommodate a semiconductor wafer. Here, as shown in FIG. 1, a case where a conveying object is conveyed from building A to building B will be described. The conveying system 1 is supported by a rack 2a and a suspension support member 2b that hang on a suspension steel member 2 of building A or B. In addition, the conveying system 1 has a plurality of conveyer units 10 that can convey a conveying object independently, a connection mechanism 20 that connects two adjacent conveyer units 10, and a connection member 30.

The conveying system 1 according to this embodiment conveys the conveying object from building A to building B by sequentially conveying the conveying object placed on the conveyer unit 10 to an adjacent conveyer unit 10. To a rack 2a of building A or B in which the conveying system 1 is disposed, a fall preventing net 3 that prevents the conveyer unit 10 from falling to the ground through a gap between two racks 2a is attached. The suspension support member 2b is disposed in a position that is not brought into contact with the racks 2a even in a case where the racks 2a of buildings A and B axe brought into contact with each other and vibrated due to an earthquake or a big wind. In particular, the suspension support member 2b is disposed in a position apart by at least 1000 mm from an adjacent rack 2a. Accordingly, even when the rack 2a of buildings A and the rack 2a of building B are brought into contact with each other due to an earthquake or a big wind, the rack 2a vibrated by the contact is not brought into contact with the suspension support member 2b. Accordingly, the damage of the conveyer unit 10 supported by the suspension support member 2b can be prevented. In addition, when the conveyer unit 10 is needed to be supported between the suspension support member 2b and the rack 2a that are apart from each other by 1000 mm or more, the conveyer unit 10 is supported by a support member 2c that hangs on the suspension steel member 2 using a groove (not shown) disposed on a side of the conveyer unit 10.

Each one of the plurality of the conveyer units 10 has a driving section that is configured by a motor, a belt, a pulley, and the like and a control unit that controls the driving section 10. The conveyer units 10 can move or stop a conveying object independently. The plurality of the conveyer units 10 includes a conveyer unit 10 that is installed on the rack 2a hanging on the suspension steel member 2 disposed in building A or B and a conveyer unit 10 that is supported by the suspension support member 2b. The conveyer unit 10 installed on the rack 2a is placed to be movable and rotatable on the rack 2a. The conveyer unit 10 supported by the suspension support member 2b is fixed to the suspension support member 2b, differently from the conveyer unit 10 installed on the rack 2a. The adjacent conveyer units 10 on the rack 2a are connected with the connection mechanism 20. In addition, the conveyer unit 10 supported by the suspension support member 2b and a conveyer unit 10 adjacent thereto 10 are connected to each other with the connection member 30.

Figure 2:
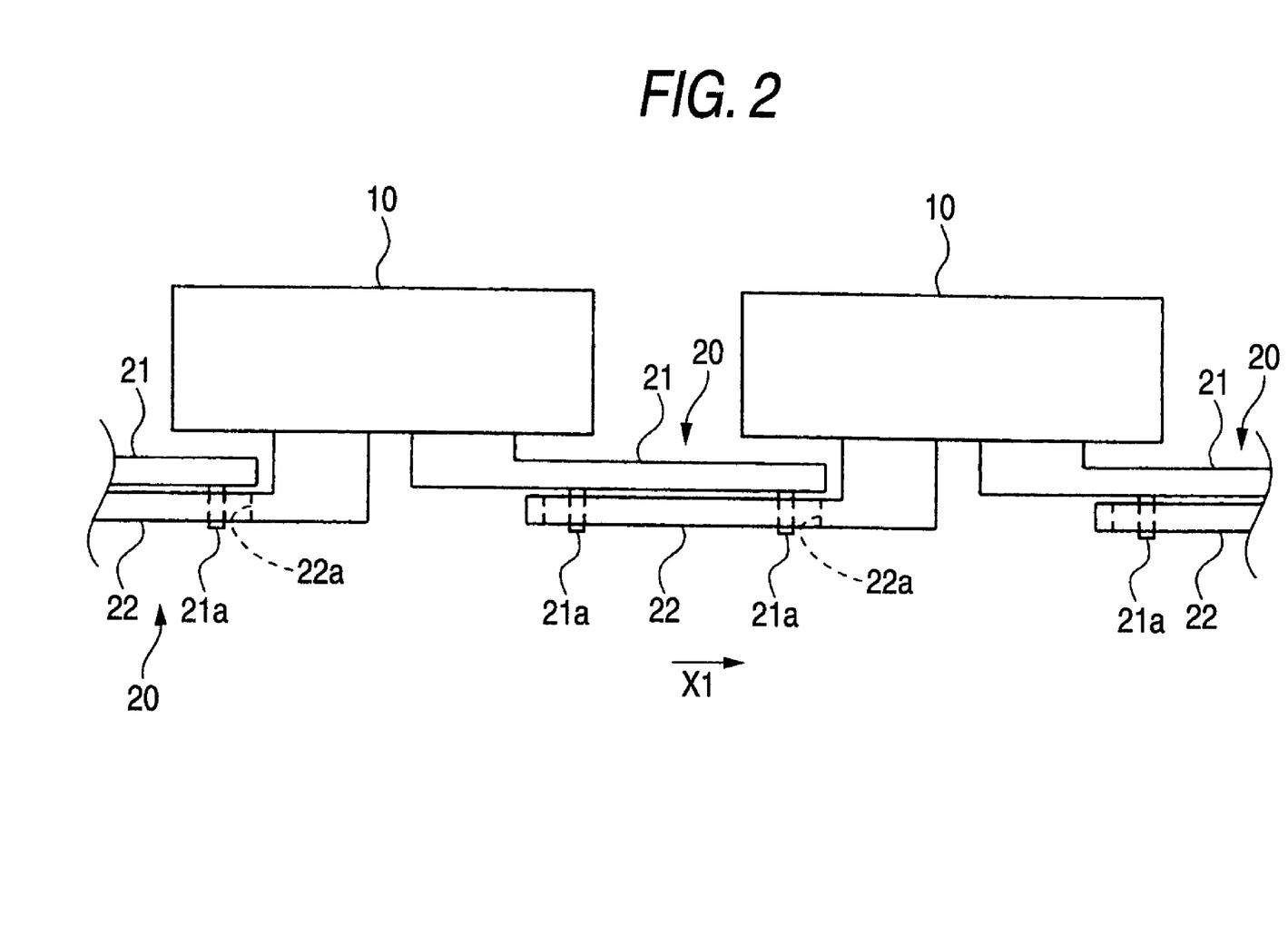
FIG. 2 is an enlarged diagram of the conveying system shown in FIG. 1.

The connection mechanism 20, as shown in FIG. 2, connects the conveyer units 10 that are rotated and/or moved on the rack 2a. The connection mechanism 20 arranges the plurality of the conveyer units 10 in a meandering manner (see FIG. 3) by slightly changing the gap and direction of the adjacent conveyer units 10 in a case where the relative positions of buildings A and B are changed. The connection mechanism 20, as shown in FIGS. 2 and 4(a), has a connection plate 21 that is attached to a conveyer unit 10 located on the upstream side and a connection plate 22 that is attached to a conveyer unit 10 located on the downstream side which is adjacent to the conveyer 10 unit located on the upstream side. In the connection plate 21, two cam pins 21a protruding toward the lower side (the connection plate 22 side) are formed with a predetermined gap maintained therebetween along the conveying direction (direction X1) of the conveyer unit 10. In addition, in the connection plate 22, a cam groove 22a that is formed along the conveying direction (direction X1) of the conveyer unit 10 is disposed, and the two cam pins 21a of the above-described connection plate 21 are inserted into the cam groove 22a to be movable. The cam pins 21a are designed to be broken in a case where the cam pins 21a are brought into contact with the inside of the cam groove 22a by a predetermined force level or more. Accordingly, when the adjacent conveyer units 10 are moved apart from each other by a predetermined gap or more or moved close to each other within a predetermined gap, the cam pins 21a are broken so as to release the connection between the conveyer units 10.

With the above-described configuration, as shown in FIG. 4(b), the conveyer unit 10 located on the upstream side and the conveyer unit 10 located on the downstream side can be moved in a direction (direction Y1 or direction Y2) for intersecting the conveying direction until two cam pins 21a are brought into contact with the inner wall of the cam groove 22a on one side (or the inner wall of the cam groove on the other side). In addition, as shown in FIG. 4(c), the conveyer unit 10 located on the upstream side and the conveyer unit 10 located on the downstream side can be moved in the conveying direction (direction X1) and a direction (direction X2) opposite thereto until the cam pin 21a located on one side (or the cam pin 21a located on the other side) is brought into contact with one end portion (or the other end portion) of the cam groove 22a. In addition, as shown in FIG. 4(d), the conveyer unit 10 located on the upstream side and the conveyer unit 10 located on the downstream side can be rotated from when the cam pin 21a located on one side is brought into contact with the inner wall of the cam groove 22a located on one side (or the inner wall of the cam groove located on the other side) to when the cam pin 21a located on the other side is brought into contact with the inner wall of the cam groove 22a on the other side (or the inner wall of the cam groove on one side). At this moment, as the cam pin 21a located on one side is brought into contact with the inner wall of the cam groove 22a on one side (or the inner wall of the cam groove on the other side) and the cam pin 21a located on the other side is brought into contact with the inner wall of the cam groove 22a on the other side (or the inner wall of the cam groove on one side), the conveyer unit 10 located on the upstream side is regulated to be relatively rotated by about ±1° with respect to the conveying direction of the conveyer unit 10 located on the downstream side.

The connection member 30, as shown in FIG. 1, connects the conveyer unit 10 supported by the suspension support member 2b and a conveyer unit 10 adjacent to the conveyer unit 10. The connection member 30, differently from the connection mechanism 20, fixes the conveyer units without changing the gap and direction of the adjacent conveyer units 10.

Next, the operation of the conveying system 1 in a case where relative positions of the buildings are changed will be described with reference to FIG. 3 and FIGS. 4(a) to 4(d). In this embodiment, a case where building A is moved in a direction (direction Y1 or Y2) for intersecting the conveying direction with respect to building B will be described.

Figure 3:
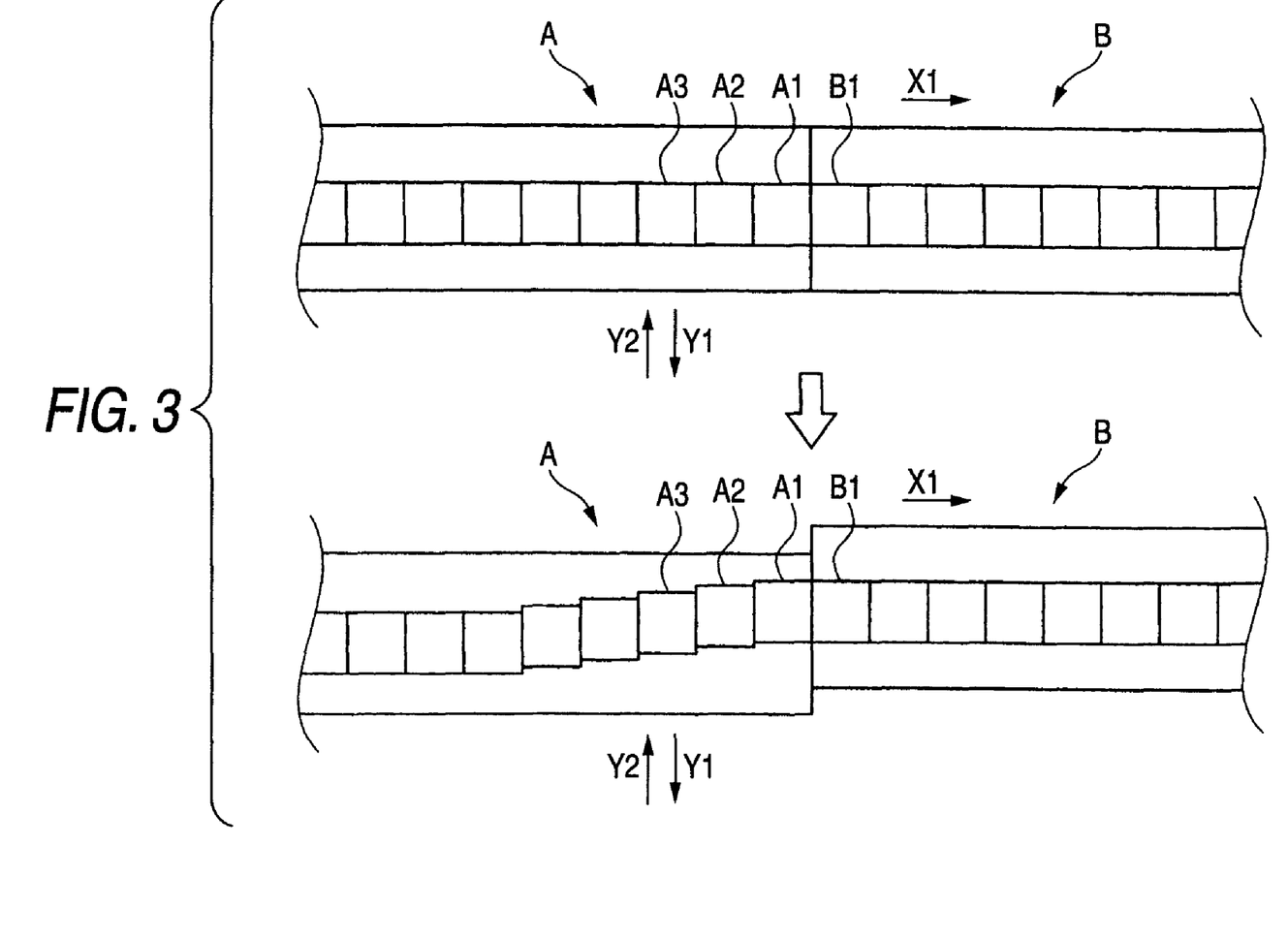
FIG. 3 is a schematic diagram showing states before and after a change in relative positions of buildings.
Figure 4:
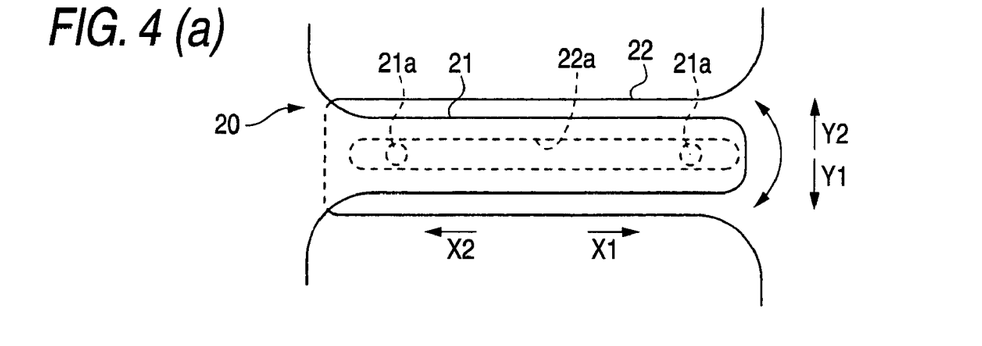
FIGS. 4(a) to 4(d) are plan views of a connection mechanism of a conveyer unit of the conveying system shown in FIG. 1.

When the relative position of building A is changed in a direction (direction Y1) for intersecting the conveying direction with respect to building B due to an earthquake or a big wind, as shown in FIG. 3, the conveyer unit A1 of building A which is connected to the conveyer unit B1 of building B is moved (slid) on the rack 2a in a direction (direction Y2) opposite to direction Y1. In particular, as the cam pins 21a of the connection plate 21 attached to the conveyer unit A1 that moves in direction Y1 in accordance with the movement of building A, as shown in FIG. 4(b), are engaged with the cam groove 22a of the connection plate 22 attached to the conveyer unit B1 of building B, the conveyer unit A1 connected to the conveyer unit B1 is moved (slid) on the rack 2a in direction Y2. At this moment, as shown in FIG. 4(d), the conveyer unit A1 that has moved on the rack 2a through the connection mechanism 20 is slight rotated in the direction of the conveyer unit B1. Accordingly, the conveying outlet of the conveyer unit A1 and the conveying inlet of the conveyer unit B1 are disposed to face each other, and thereby exchange of the conveying object between the conveyer unit A1 and the conveyer unit B1 is performed smoothly. As described above, even in a case where the relative positions of building A and building B are changed in a direction (direction Y1 or Y2) for intersecting the conveying direction, it is possible to convey the conveying object from the conveyer unit A1 of building A to the conveyer unit B1 of building B which is connected to the conveyer unit A1.

Then, the conveyer unit A2 of building A which is connected to the conveyer unit A1 of building A is moved (slid)

on the rack 2a in direction Y2 in accordance with the movement (slide) of the conveyer unit A1 on the rack 2a in direction Y2. In particular, as the cam pins 21a of the connection plate 21 attached to the conveyer unit A2 that is moved in direction Y1 in accordance with the movement of building A, as shown in FIG. 4(b), are engaged with the cam groove 22a of the connection plate 22 attached to the conveyer unit A1, the conveyer unit A2 connected to the conveyer unit A1 is moved (slid) on the rack 2a in direction Y2. At this moment, as shown in FIG. 4(d), the conveyer unit A2 that has moved on the rack 2 a through the connection mechanism 20 is slight rotated in the direction of the conveyer unit A1. Accordingly, the conveying outlet of the conveyer unit A2 and the conveying inlet of the conveyer unit A1 are disposed to face each other, and thereby exchange of the conveying object between the conveyer unit A2 and the conveyer unit A1 is performed smoothly. As described above, even in a case where the conveyer unit A1 is moved (slid) on the rack 2a in direction Y2, it is possible to convey the conveying object from the conveyer unit A2 to the conveyer unit A1 connected to the conveyer unit A2.

Thereafter, in a similar manner, the conveyer unit A3 connected to the conveyer unit A2 and the conveyer unit A4 connected to the conveyer unit A3 are sequentially moved on the rack 2a. Then, the conveyer units 10 inside building A are arranged in a meandering manner.

In this embodiment, as described above, even in a case where the relative positions of building A and building B are changed due to an earthquake or a big wind, the plurality of the conveyer units 10 arranged in the meandering manner through the connection mechanisms 20. Accordingly, it is possible to convey the conveying object from building A to a second building B by using the plurality of the conveyer units 10 arranged in the meandering manner.

In this embodiment, the cam pins 21a are designed to be broken in a case where the cam pins 21a are brought into contact with the inside of the cam groove 22a by a predetermined force level or more. Accordingly, when the adjacent conveyer units 10 are moved apart from each other by a predetermined gap or more or moved close to each other within a predetermined gap, the cam pins 21a are broken so as to release the connection between the conveyer units 10. As a result, influence on conveyer units 10 other than the conveyer unit 10 relating to the cam pins 21a can be suppressed.

In addition, in this embodiment, the movement and rotation of the conveyer units 10 on the rack 2a can be easily performed by placing the plurality of the conveyer units 10 to be movable and rotatable on the rack 2a hanging on building A or B. Therefore, the plurality of the conveyer units 10 can be easily arranged in the meandering manner.

Second Embodiment

A conveying system according to the second embodiment of the present invention will be described with reference to FIGS. 5(a) to 5(d). In this second embodiment, the conveying system having a connection mechanism 120 different from that of the conveying system 1 according to the first embodiment will be described. In this second embodiment, since the configuration other than the connection mechanism 120 is the same as that of the first embodiment, a description thereof is omitted here.

Figure 5:
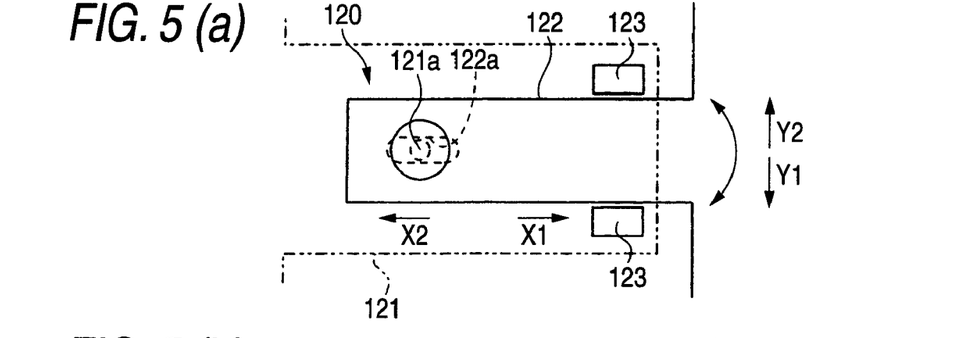
FIGS. 5(a) to 5(d) are plan views of a conveyer unit of a conveying system according to a second embodiment of the present invention.

As shown in FIG. 5(a), the connection mechanism 120 connects conveyer units 10 that are rotated and/or moved on a rack 2a. The connection mechanism 120 arranges a plurality of the conveyer units 10 in the meandering manner by slightly changing the gap and direction of the adjacent conveyer units 10 in a case where the relative positions of buildings A and B are changed. The connection mechanism 120, as shown in FIG. 5(a), has a connection plate 121 that is attached to a conveyer unit 10 located on the upstream side, a connection plate 122 that is attached to a conveyer unit 10 located on the downstream side which is adjacent to the conveyer 10 unit located on the upstream side, and a rotation regulating member 123 that is attached to the connection plate 121. In the connection plate 121, one cam pin 121a protruding toward the lower side (the connection plate 122 side) is formed. In addition, in the connection plate 122, a cam groove 122a that is formed along the conveying direction of the conveyer unit 10 is disposed, and the cam pin 121a of the above-described connection plate 121 is inserted into the cam groove 122a to be movable. The cam pin 121a is designed to be broken in a case where the cam pin 121a is brought into contact with the inside of the cam groove 122a by a predetermined force level or more. Accordingly, when the adjacent conveyer units 10 are moved apart from each other by a predetermined gap or more or moved close to each other within a predetermined gap, the cam pin 121a is broken so as to release the connection between the conveyer units 10, In addition, the rotation regulating member 123 regulates rotation of the connection plate 122 that is rotated with respect to the connection plate 121.

With the above-described configuration, as shown in FIG. 5(b), the conveyer unit 10 located on the upstream side and the conveyer unit 10 located on the downstream side can be moved in a direction (direction Y1 or direction Y2) for intersecting the conveying direction until the cam pin 121a is brought into contact with the inner wall of the cam groove 122a on one side (or the inner wall of the cam groove on the other side). In addition, as shown in FIG. 5(c), the conveyer unit 10 located on the upstream side and the conveyer unit 10 located on the downstream side can be moved in the conveying direction (direction X1) and a direction (direction X2) opposite thereto until the earn pin 121a is brought into contact with one end portion (or the other end portion) of the cam groove 122a. In addition, as shown in FIG. 5(d), the connection plate 122 of the conveyer unit 10 located on the downstream side can be rotated until it is brought into contact with the rotation regulating member 123. At this moment, the conveyer 10 located on the upstream side is designed to be relatively rotated by about ±1° with respect to the conveying direction of the conveyer unit 10 located on the downstream side.

Third Embodiment

A conveying system according to the third embodiment of the present invention will be described, with reference to FIGS. 6(a) to 6(d) and FIGS. 7(a) to 7(d). In this third embodiment, a conveying system having a connection mechanism 220 different from those of the conveying systems according to the first and second embodiments will be described. In this third embodiment, since the configuration other than the connection mechanism 220 is the same as those of the first and second embodiments, a description thereof is omitted here.

Figure 6:
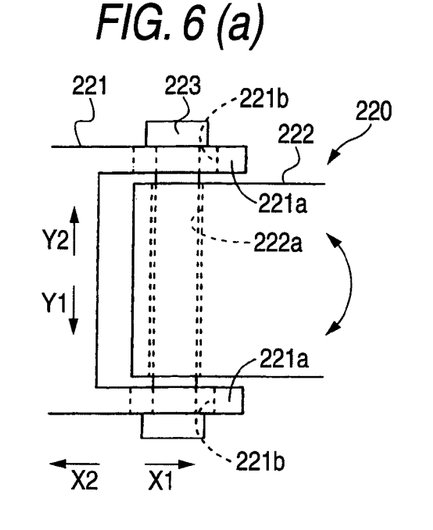
FIGS. 6(a) to 6(d) are plan views of a conveyer unit of a conveying system according to a third embodiment of the present invention.
Figure 7:
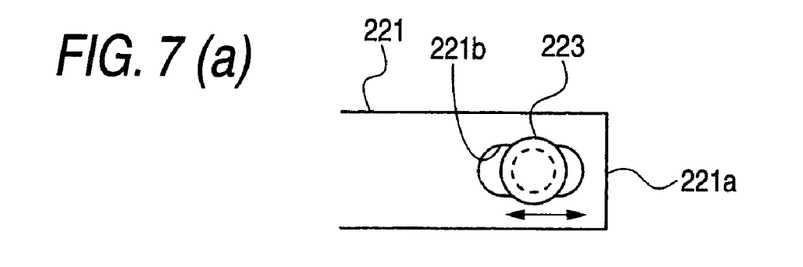
FIGS. 7(a) to 7(d) are side views of a conveyer unit of a conveying system according to the third embodiment of the present invention.

The connection mechanism 220 connects conveyer units 10 that are rotated and/or moved on a rack. The connection mechanism 220 arranges a plurality of the conveyer units 10 in the meandering manner by slightly changing the gap and direction of the adjacent conveyer units 10 in a case where the relative positions of buildings A and B are changed. The connection mechanism 220, as shown in FIGS. 6(a) and 7(a), has a connection plate 221 that is attached to a conveyer unit 10 located on the upstream side, a connection plate 222 that is attached to a conveyer unit 10 located on the downstream side which is adjacent to the conveyer 10 unit located on the upstream side, and a cam pin 223. In the connection plate 221, a pair of convex pieces 221a extending toward the connection plate 222 side is integrally formed. On a side of each convex piece 221a, a cam groove 221b is formed along the conveying direction of the conveyer unit 10. In addition, the connection plate 222 is disposed in an area formed by one pair of the convex pieces 221a of the connection plate 221, and a pin attaching hole 222a is formed in a spot corresponding to the cam groove 221b disposed in one pair of the convex pieces 221a. To the pin attaching hole 222a and the above-described one pair of the cam grooves 221b, the cam pin 223 is attached. In addition, the pin attaching hole 222a formed in the connection plate 222 has an outer diameter larger than that of the cam pin 223, and the pin attaching hole 222a and the cam pin 223 are attached with a predetermined gap interposed therebetween.

With the above-described configuration, as shown in FIGS. 6(b) and 7(b), the conveyer unit 10 located on the upstream side and the conveyer unit 10 located on the downstream side can be moved in a direction (direction Y1 or direction Y2) for intersecting the conveying direction until the connection plate 222 of the conveyer unit 10 located on the downstream side is brought into contact with the convex pieces 221a of the connection plate 221 of the conveyer unit 10 located on the upstream side. In addition, as shown in FIGS. 6(c) and 7(c), the conveyer unit 10 located on the upstream side and the conveyer unit 10 located on the downstream side can be moved in the conveying direction (direction X1) and a direction (direction X2) opposite thereto until the cam pin 223 is brought into contact with one end or the other end portion of the one pair of the cam grooves 221b. In addition, as shown in FIGS. 6(d) and 7(d), the conveyer unit 10 located on the upstream side and the conveyer unit 10 located on the downstream side can be rotated by the amount of the shaky movement of the pin attaching hole 222a of the connection plate 222 of the conveyer unit 10 located on the downstream side with respect to the cam pin 223. At this moment, the conveyer unit 10 located on the upstream side is designed to be relatively rotated by about ±1° with respect to the conveying direction of the conveyer unit 10 located on the downstream side.

It should be considered that the above-described embodiments are examples in every aspect and are not for purposes of limitation. The scope of the present invention is defined not by the detailed descriptions of the embodiments but by the appended claims, and all changes within the meaning and scope equivalent to the scope of the claims belong to the present invention.

For example, in the above-described embodiments, an example in which the conveyer units are installed on a rack hanging on the suspension steel member of a building has been described. However, the present invention is not limited thereto, and the conveyer units may be installed by using various methods such as a method in which the conveyer units are installed to the bottom of a building. In such a case, it is preferable that the conveyer units are placed to be movable and rotatable.

In addition, in the above-described embodiments, a conveying system that conveys a conveying object from building A to building B has been described. However, the present invention is not limited thereto, and may be applied to a conveying system that conveys a conveying object over a plurality of buildings in an easy manner.

In addition, in the above-described first embodiment, an example in which two cam pins to be inserted into the cam groove are disposed has been described. However, the present invention is not limited thereto, and three or more cam pins may be disposed.

In addition, in the above-described embodiments, an example in which a conveyer unit having a driving section that is configured by a motor, a belt, a pulley, and the like is used has been described. However, the present invention is not limited thereto, and a conveyer unit using a driving method other than a belt driven method may be used.

What is claimed is:

1. A conveying system being operable to convey a conveying object from a first building to a second building and being arranged along a conveying direction, the conveying system comprising:
   a plurality of conveying apparatuses arranged from the inside of the first building to the inside of the second building along the conveying direction; and
   a plurality of connection mechanisms connecting each pair of adjacent conveying apparatuses from the first building to the second building,
   wherein the conveying apparatuses are movably and rotatably installed on a rack which is fixed to the first building or the second building, and
   wherein the connection mechanisms are configured so as to connect the adjacent conveying apparatuses such that a gap and a direction of the adjacent conveying apparatuses are changeable,
   wherein each of the connection mechanisms includes:
      a first connection member provided in a first conveying apparatus of the conveying apparatuses;
      a second connection member provided in a second conveying apparatus of the conveying apparatuses and formed with a pin attaching hole, the second conveying apparatus located adjacent to the first conveying apparatus;
      a pair of cam grooves formed in the first connection member along the conveying direction; and
      a cam pin movably inserted into the cam grooves and attached to the pin attaching hole such that a predetermined gap is formed therebetween.

2. The conveying system as set forth in claim 1, wherein the cam pin is broken when the first connection member and the second connection member are moved apart from each other beyond a predetermined gap or are moved close to each other within a predetermined gap.

* * * * *